United States Patent
Kong (10) Patent No.: US 9,287,007 B2
(45) Date of Patent: Mar. 15, 2016

(54) FAIL ADDRESS STORAGE CIRCUIT, REDUNDANCY CONTROL CIRCUIT, METHOD FOR STORING FAIL ADDRESS AND METHOD FOR CONTROLLING REDUNDANCY

(75) Inventor: Yong-Ho Kong, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 358 days.

(21) Appl. No.: 13/610,283

(22) Filed: Sep. 11, 2012

(65) Prior Publication Data
US 2013/0182517 A1    Jul. 18, 2013

(30) Foreign Application Priority Data
Jan. 12, 2012   (KR) .................... 10-2012-0003983

(51) Int. Cl.
*G11C 29/04* (2006.01)
*G11C 29/44* (2006.01)
*G11C 29/00* (2006.01)

(52) U.S. Cl.
CPC .............. *G11C 29/44* (2013.01); *G11C 29/785* (2013.01); *G11C 2029/4402* (2013.01)

(58) Field of Classification Search
CPC ........ G11C 29/00; G11C 29/04; G11C 29/18; G11C 29/70; G11C 29/785; G11C 2029/4402; G11C 29/44

USPC .................. 365/200, 201, 210.1, 96
See application file for complete search history.

(56) References Cited

U.S. PATENT DOCUMENTS

| | | | | |
|---|---|---|---|---|
| 5,732,029 A * | 3/1998 | Lee et al. | ...... | 365/200 |
| 6,005,813 A * | 12/1999 | Waller et al. | ...... | 365/200 |
| 6,259,636 B1 * | 7/2001 | Fukuda et al. | ...... | 365/200 |
| 6,490,209 B1 * | 12/2002 | Vollrath et al. | ...... | 365/200 |
| 8,059,477 B2 * | 11/2011 | Yoon | ...... | 365/200 |
| 2005/0024956 A1 * | 2/2005 | Tran et al. | ...... | 365/200 |
| 2005/0047225 A1 * | 3/2005 | Noguchi | ...... | 365/200 |
| 2006/0092725 A1 * | 5/2006 | Min et al. | ...... | 365/200 |
| 2009/0168570 A1 * | 7/2009 | Park | ...... | 365/200 |
| 2011/0013469 A1 * | 1/2011 | Park et al. | ...... | 365/200 |

FOREIGN PATENT DOCUMENTS

KR   1020010037890   5/2001

* cited by examiner

*Primary Examiner* — Douglas King
(74) *Attorney, Agent, or Firm* — IP & T Group LLP (57) ABSTRACT

A redundancy control circuit includes: a fail address storage unit configured to store a fail address; a shared storage unit configured to store data as to whether a value stored in the fail address storage unit corresponds to both of a first address and a second address; an address comparator configured to compare a value stored in the fail address storage unit with a first input address and a second input address, respectively; and a redundancy controller configured to control a redundancy operation in response to a value stored in the shared storage unit and comparison results of the address comparator.

8 Claims, 4 Drawing Sheets

FAIL ADDRESS STORAGE CIRCUIT, REDUNDANCY CONTROL CIRCUIT, METHOD FOR STORING FAIL ADDRESS AND METHOD FOR CONTROLLING REDUNDANCY

CROSS-REFERENCE TO RELATED APPLICATIONS

The present application claims priority of Korean Patent Application No. 10-2012-0003983, filed on Jan. 12, 2012, which is incorporated herein by reference in its entirety.

BACKGROUND

1. Field

Exemplary embodiments of the present invention relate to a fail address storage circuit, a redundancy control circuit, a method for storing a fail address, and a method for controlling redundancy.

2. Description of the Related Art

Generally, when a semiconductor memory device has one or more defective memory cells, the memory device may be discarded as defective products. Therefore, redundancy using reserved memory cells that are arranged in a semiconductor memory device to compensate for defective memory cells is used.

When a process of fabricating a wafer ends, defective memory cells are detected by a test and are programmed by performing fuse cutting. Positional information of the defective memory cells (that is, an address at which the fuse is cut) is stored such that redundancy memory cells are prepared so as to replace the defective memory cells.

Figure 1:
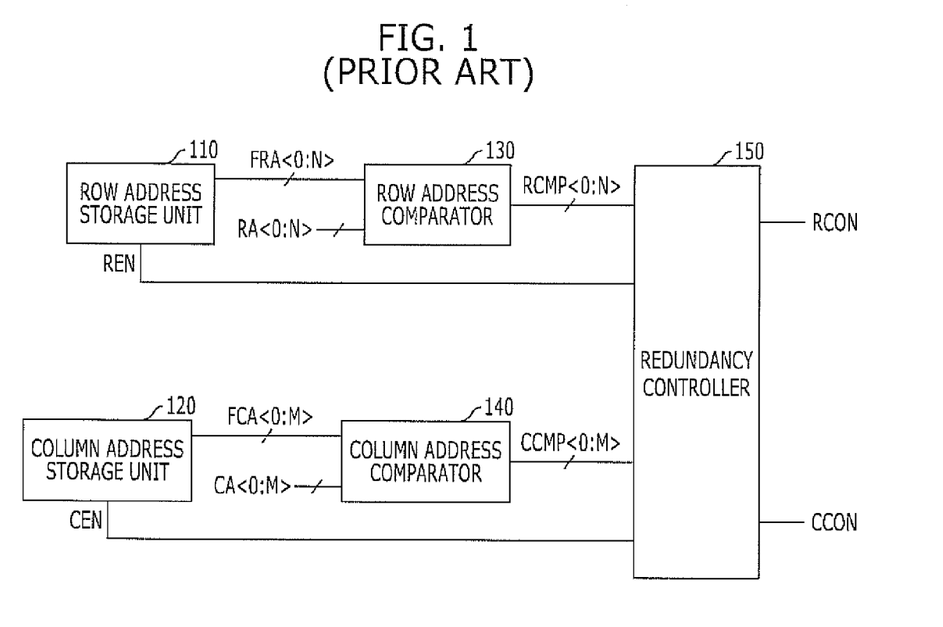
FIG. 1 is a configuration diagram of a redundancy control circuit in accordance with the related art.

FIG. 1 is a configuration diagram of a redundancy control circuit in accordance with the related art.

As illustrated in FIG. 1, the redundancy control circuit is configured to include a row address storage unit 110, a column address storage unit 120, a row address comparator 130, a column address comparator 140, and a redundancy controller 150.

Hereinafter, an operation of the redundancy control circuit will be described with reference to FIG. 1.

The row address storage unit 110 and the column address storage unit 120 each include a plurality of fuses. One of the plurality of fuses is cut according to whether the fail address is stored in the row address storage unit 110, where the cut fuse is referred to as 'enable fuse'. For example, when the 'enable fuse' of the plurality of fuses of the row address storage unit 110 is cut, a value of the fail address (row address) is stored in the remaining fuses and when the 'enable fuse' is not cut, the value of the fail address is not stored in the remaining fuses. It is determined whether a row enable signal REN is activated according to whether the 'enable fuse' is cut. Each bit of the fail address is stored in the remaining fuse. Hereinafter, a row redundancy operation will be described.

The row address storage unit 110 is stored with the row address (fail address) that corresponds to a memory cell to be repaired. The fail address is stored and thus, the 'enable fuse' included in the row address storage unit 110 is cut. Hereinafter, a value stored in the row address storage unit 110 is referred to as a row address FRA<0:N>.

The row address storage unit 110 outputs the row address FRA<0:N> stored therein and activates the row enable signal REN since the 'enable fuse' is cut.

The row address comparator 130 compares an address RA<0:N> (hereinafter, referred to as an input row address RA<0:N>) input from the outside with a row address FRA<0: N> (hereinafter, referred to as a row address FRA<0:N>) stored in the row address storage unit 110 to generate comparison information RCMP<0:N>. Each bit of the comparison information RCMP<0:N> is activated when the corresponding bits of each bit RA<0> to RA<N> of the input row address and each bit FRA<0> to FRA<N> of the row address are equal to one another. For example, when a first bit RA<0> of the input row address is equal to a first bit FRA<0> of the row address, a first bit RCMP<0> of the comparison information is activated. Therefore, when the input row address RA<0:N> is completely equal to the row address FRA<0:N>, all the bits RCMP<0> to RCMP<N> of the comparison information are activated.

The redundancy controller 150 controls a row redundancy operation in response to the row enable signal REN and the comparison information RCMP<0:N>. When the row enable signal REN and all the bits RCMP<0> to RCMP<N> of the comparison information are activated (that is, when the row enable signal REN is activated and values of all of the corresponding bits of each bit RA<0> to RA<N> and each bit FRA<0> to FRA<N> of the row address are equal to one another), a row redundancy control signal RCON is activated. When the row redundancy control signal RCON is activated, redundancy word lines are activated, instead of original word lines corresponding to the input row address RA<0:N>.

The column redundancy operation is approximately the same as the above-mentioned row redundancy operation. The 'enable fuse' of the plurality of fuses included in the column address storage unit 120 is cut according to whether the fail address is stored in the column address storage unit 120. Further, a column address signal CEN is activated or inactivated according to whether the 'enable fuse' is cut. The column address comparator 140 compares an input column address CA<0:M> with a column address FCA<0:M> (hereinafter, referred to as a column address FCA<0:M>) stored in the column address storage unit 120 to generate comparison information CCMP<0:M>. The redundancy controller 150 activates or inactivates a control signal CCON in response to the column enable signal CEN and the comparison information CCMP<0:M>. Here, when the column enable signal CEN is activated and the input column address CA<0:M> is completely equal to the column address FCA<0:M> (when all the bits CCMP<0> to CCMP<M> are activated), the column redundancy control signal CCON is activated. When the column redundancy control signal CCON is activated, data of the memory cells connected to the redundancy bit lines are accessed, instead of the original bit lines corresponding to the input column address CA<0:N>.

The redundancy control circuit includes a plurality of row/ column address storage units 110 and 130 so as to store a plurality of failed row/column addresses. However, the row address storage unit 110 may store the row address only and the column address storage unit 130 may store the column address only. Therefore, even though the values of the row address are equal to the values of the column address and may be stored in a single address storage unit, the values end up being separately stored in the row address storage unit and column address storage unit, respectively. Here, the values of the row address are equal to the values of the column address when values of the corresponding bits of the row address and the column address are equal to one another.

As a result, flexibility of the redundancy operation may be degraded and the address storage units 110 and 130 may not be efficiently used.

SUMMARY

An embodiment of the present invention is directed to a fail address storage circuit that stores data as to whether stored values correspond to all of the row addresses and the column addresses to store the row addresses and the column addresses having the same values in a single fail address storage unit, thereby using the same number of fail address storage units to store more fail addresses.

In accordance with an embodiment of the present invention, a redundancy control circuit includes: a fail address storage unit configured to store a fail address; a shared storage unit configured to store data as to whether a value stored in the fail address storage unit corresponds to both of a first address and a second address; an address comparator configured to compare a value stored in the fail address storage unit with a first input address and a second input address, respectively; and a redundancy controller configured to control a redundancy operation in response to a value stored in the shared storage unit and comparison results of the address comparator.

In accordance with another embodiment of the present invention, a method for storing a fail address using a fail address storage circuit storing the fail address includes: detecting one or more first address and one or more second address of one or more defective memory cell by testing a memory device; detecting one or more first address and one or more second address of one or more defective memory cell by testing a memory device; detecting second address having a value corresponding to the first address among the one or more second address; and storing one or more first address and the one or more second address, separately, in the fail address storage circuit and storing the first address and the second address having a value corresponding to the first address in a single fail address storage circuit.

In accordance with another embodiment of the present invention, a redundancy control circuit includes: a fail address storage unit configured to store a fail address; a shared storage unit configured to store data as to whether a value stored in the fail address storage unit corresponds to both of a first address and a second address; an address comparator configured to compare a first group of bits for the value stored in the fail address with a first address and compare a second groups of bits for the value with a second address; and a redundancy controller configured to control a redundancy operation in response to values stored in the shared storage unit and comparison results of the address comparator.

In accordance with another embodiment of the present invention, a method for controlling redundancy using a redundancy control circuit including the fail address storage circuit storing the fail address includes: activating a first enable signal and a second enable signal when a value stored in the fail address storing circuit corresponds to both of a first address and a second address at the time of a redundancy operation; and controlling a first redundancy operation by comparing the value stored in the fail address storage circuit with a first input address when the first enable signal is activated and controlling a second redundancy operation by comparing a value stored in the fail address storage circuit with a second input address when the second enable signal is activated.

In accordance with another embodiment of the present invention, a fail address storage circuit includes: a fail address storage unit configured to store a fail address; and a shared storage unit configured to store data as to whether a value stored in the fail address storage unit corresponds to both of a first address and a second address.

DETAILED DESCRIPTION

Hereinafter, exemplary embodiments of the present invention will be described with reference to the accompanying drawings so that a person with an ordinary skilled in the art to which the present invention pertains can easily carry out technical ideas of the present invention.

Figure 2:
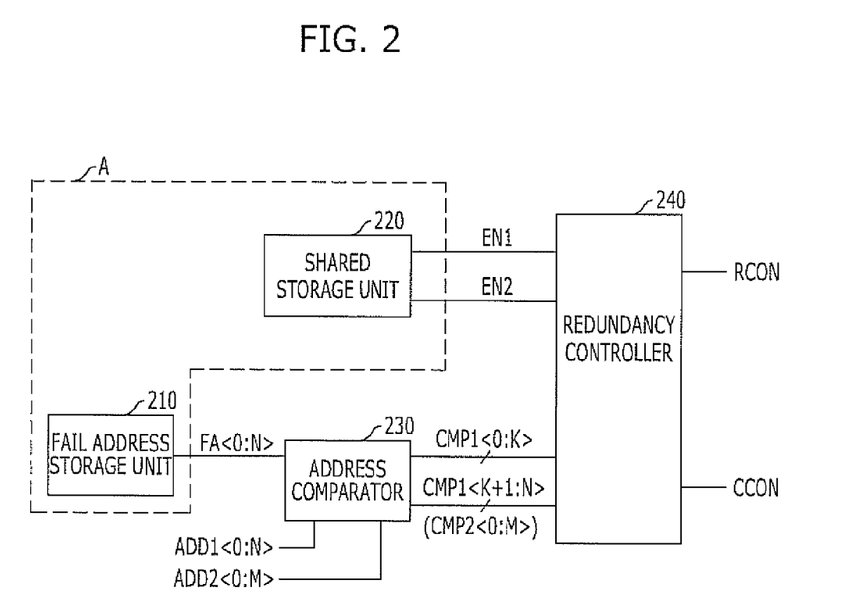
FIG. 2 is a configuration diagram of a redundancy control circuit including a fail address storage circuit A in accordance with an embodiment of the present invention.

FIG. 2 is a configuration diagram of a redundancy control circuit including a fail address storage circuit A in accordance with an embodiment of the present invention.

As illustrated in FIG. 2, the redundancy control circuit is configured to include a fail address storage unit 210 storing fail addresses, a shared storage unit 220 storing whether a value FA<0:N> stored in the fail address storage unit 210 corresponds to both of a first address and a second address, an address comparator 230 comparing a value FA<0:N> stored in the fail address storage unit with a first input address ADD1<0:N> and a second input address ADD2<0:M>, respectively, and a redundancy controller 240 controlling a redundancy operation in response to the value stored in the shared storage unit 220 and comparison results of the address comparator 230.

The first address corresponds to an address stored in the fail address storage unit 210, and the second address corresponds to an address stored in the fail address storage unit 210 when the second address is the same as the first address. In other words, when the fail address storage unit 210 is stored with the first address and has the second address having "a value corresponding to" the first address, the first address and the second address having a value corresponding to the first address are stored in the same fail address storage unit 210. The number of bits of the first address may be equal to or more than the number of bits of the second address. The first input address ADD1<0:N> is a first address applied from the outside and the second input address ADD2<0:M> is a second address applied from the outside.

Here, the first address and the second address have corresponding values when designated bits of the first address are equal to designated bits of the second address. For example, when the first address is 4-bit (address1<0> to address1<3>), the second address is 2-bit (address2<0> and address2<1>), and designated bits to be compared with the second address among the bits of the first address is 'address1<0> and address1<1>', if the values of the designated bits of the first address and the second address are equal to one another (for example, address1<0>=address2<0> and address1<1>=address2<1>), the first address and the second address is determined to have values corresponding to each other. Here, the designated bits of the first address and the designated bits of the second address may be changed according to different design needs.

Hereinafter, the redundancy control circuit will be described with reference to FIG. 2.

One of the first address ADD1<0:N> and the second address ADD2<0:M> may be a row address and the other thereof may be a column address. Hereinafter, the case in which the first address ADD1<0:N> is a row address and includes N+1 bit and the second address ADD2<0:M> is a column address and includes M+1 bit will be described. The number of bits of an address may be changed according to different design needs.

The row addresses corresponding to word lines of which the defects are detected through a test of a memory device or the column addresses corresponding to bit lines of which the defects are detected are detected and the fail addresses (collectively referred to as the row addresses and the column addresses of which the defects are detected) are stored in the fail address storage unit 210. As described above, the row addresses and the column addresses having values corresponding to one another may be stored in the fail address storage unit 210.

The fail address storage unit 210 may be configured to include a first fail address storage unit (not illustrated in FIG. 2) in which the stored value corresponds to a portion of the row address and a second fail address storage unit (not illustrated in FIG. 2) in which the stored value corresponds to a portion of the row address or a portion of the row address and the column address. A detailed description of the first fail address storage unit and the second fail address storage unit will be described below with reference to FIG. 3.

In this case, even when the fail address storage unit 210 is not supplied with power, the fail address storage unit may maintain the stored data. For example, the fail address storage unit 210 may include a fuse, an anti-fuse, a read only memory (ROM), and the like that store data even after a power-supply is cut off. The description of the redundancy control circuit storing data using the fuse will be described with reference to FIG. 3. According to an example, the defects in the word lines/bit lines may mean that the memory cells connected with the word lines/bit lines are defective or the word lines/bit lines are defective.

The shared storage unit 220 determines whether the fail address is stored in the fail address storage unit 210 and the stored fail address corresponds to both of the row address and the column address to generate a first enable signal EN1 (hereinafter, referred to as a row enable signal EN1 since the first address is the row address) and a second enable signal EN2 (hereinafter, a column enable signal since the second address is a column address).

The shared storage unit 220 activates the row enable signal EN1 according to values stored therein when the fail address is stored in the fail address storage unit 210. As described above, the fail address storage unit 210 stores the row address (first address) and stores the row address and the column address having values corresponding to the row address when the column address (second address) having the value corresponding to the row address is present. As a result, when the fail address is stored in the fail address storage unit 210, the fail address corresponds to the row address and thus, the row enable signal EN1 is activated.

Further, the shared storage unit 220 activates both of the low enable signal EN1 and the column enable signal EN2 according to the values stored therein when the value FA<0:N> stored in the fail address storage unit 210 corresponds to both of the row address and the column address. Here, the fact that the value FA<0:N> stored in the fail address storage unit 210 corresponds to the row address and the column address means that the value FA<0:N> stored in the fail address storage unit 210 corresponds to the row address and one or more of designated bits of the value FA<0:N> stored in the fail address storage unit 210 correspond to the column address. Hereinafter, the case in which 'FA<K+1:N>' bits of 'FA<0:N>' correspond to the column address will be described. For illustration purposes, 'FA<K+1> to FA<N>' bits are assumed to be M+1 bits.

The address comparator 230 compares the value FA<0:N> stored in the fail address storage unit 210 with the input row address ADD1<0:N> (a first input address, that is, a row address applied from the outside of the memory device for redundancy operation) or the input column address ADD2<0:M> (a second input address, that is, a column address applied from the outside of the memory device for redundancy operation) to generate comparison information CMP1<0:N> and CMP2<0:M> indicating whether the value FA<0:N> stored in the fail address storage unit 210 is the same as the input row address ADD1<0:N> or the input column address ADD2<0:M>. The first comparison information CMP1<0:N> indicates whether the value FA<0:N> stored in the fail address storage unit 210 is the same as the input row address ADD1<0:N> and the second comparison information CMP2<0:M> indicates whether the designated bits of the value FA<0:M> stored in the fail address storage unit 210 are the same as the input column address ADD2<0:M>.

Each bit CMP1<0> to CMP1<N> of the first comparison information is activated when the corresponding bits of each bit FA<0> to FA<N> of the values stored in the fail address storage unit 210 and the corresponding bits of each bit ADD1<0> to ADD1<N> of the input row address are the same and each bit CMP2<0> to CMP2<M> of the second comparison information is activated when the corresponding bits of the designated bits (for example, FA<0> to FA<M>) of the values stored in the fail address storage unit 210 and each bit ADD2<0> to ADD2<N> of the input column address are the same.

The redundancy controller 240 is a unit determining whether to perform the redundancy operation.

The redundancy controller 240 stores the fail address in the fail address storage unit 210 (the row enable signal EN1 is activated) and activates a row redundancy signal RCON to perform the row redundancy operation when the value FA<0:N> stored in the fail address storage unit 210 is the same as the row input address ADD1<0:N> (that is, all the bits (CMP1<0> to CMP1<N> are activated).

Further, the values stored in the fail address storage unit 210 correspond to all of the row addresses and the column addresses (the row enable signal EN1 and the column enable signal EN2 are activated). When the designated bits FA<0:M> of the values stored in the fail address storage unit 210 are the same as the column input address ADD2<0:M> (that is, all the bits CMP2<0> to CMP2<M> of the second comparison information), the column redundancy signal CCON is activated so as to perform the column redundancy operation.

That is, the redundancy controller 240 controls the row redundancy operation in response to the row enable signal EN1 and the first comparison information CMP1<0:N> and controls the column redundancy operation in response to the column enable signal EN2 and the second comparison information CMP2<0:M>. In this case, the redundancy operation means an operation of activating the redundancy word lines/bit lines rather than the original word lines/bit lines when the word lines/bit lines corresponding to the input row/column addresses are replaced by the redundancy word lines/bit lines due to failure in the word lines/bit lines.

Unlike the related art, the embodiment of the present invention may store only the row address in the address storage unit 210 or store a value corresponding to both the row address and the column address in the fail address storage unit 210 when the column address having the value corresponding to the row address is present and store whether the value FA<0:N> stored in the fail address storage unit 210 corresponds to both of the row address and the column address in the shared storage unit 221. Further, at the time of the redundancy operation, the row enable signal EN1 and the column enable signal EN2 are activated according to whether the fail address is stored in the fail address storage unit 210 and the value FA<0:N> stored in the fail address storage unit 210 corresponds to both of the row address and the column address, thereby storing two fail addresses in the single fail address storage 210. That is, the utilization of the fail address storage 210 is increased.

For example, the row address and the column address that are detected at the time of test each are four. Among them, the designated bits of the two row addresses each are the same as the single column address. In the case of the related art, in order to store all of the fail addresses, the row address storage unit and the column address storage unit are used (for example, 8 address storage units may be used). However, in the case of the present invention, when the row address and the column address having the same value are stored in the same fail address storage unit, for example, only a total of six fail address storage units may be used. That is, the redundancy control circuit in accordance with the embodiment of the present invention may store more fail addresses in a smaller number of address storage units than the related art.

Although the above embodiment describes the case in which the first address is the row address and the second address is the column address, according to different design needs, the first address may be the column address and the second address may be the row address. In this case, the first input address ADD1<0:N> is the input column address, and the second input address ADD2<0:M> is the input row address. The first comparison information CMP1<0:N> indicates whether the value FA<0:N> stored in the fail address storage unit 210 is the same as the input row address ADD1<0:N> and the second comparison information CMP2<0:M> indicates whether the designated bits (for example, FA<0> to FA<M>) of the values stored in the fail address storage unit 210 are the same. The first enable signal EN1 corresponds to the column enable signal and the second enable signal EN2 corresponds to the row enable signal. Here, the redundancy controller 240 controls the column redundancy operation in response to the column enable signal EN1, and the first comparison information CMP1<0:N> and controls the row redundancy operation in response to the row enable signal EN2. The detailed operation thereof is the same as the case in which the first address is the row address and the second address is the column address.

The redundancy control circuit in accordance with the embodiment of the present invention may be operated as described above since the redundancy control circuit includes the fail address storage circuit A in accordance with the embodiment of the present invention. The fail address storage circuit A in accordance with the embodiment of the present invention is configured to include the fail address storage unit 210 storing the fail address and the shared storage unit 221 storing whether the values stored in the fail address storage unit 210 correspond to both of the first address and the second address. Hereinafter, the description of the fail address storage unit 210 and the shared storing unit 221 are the same as the above description of FIG. 2.

The fail address storage circuit A in accordance with the embodiment of the present invention includes the shared storage unit 220 that can store whether the values stored in the fail address storage unit 210 correspond to both of the first address and the second address, thereby storing the first address and the second address having the same value in the fail address storage unit 210.

Figure 3:
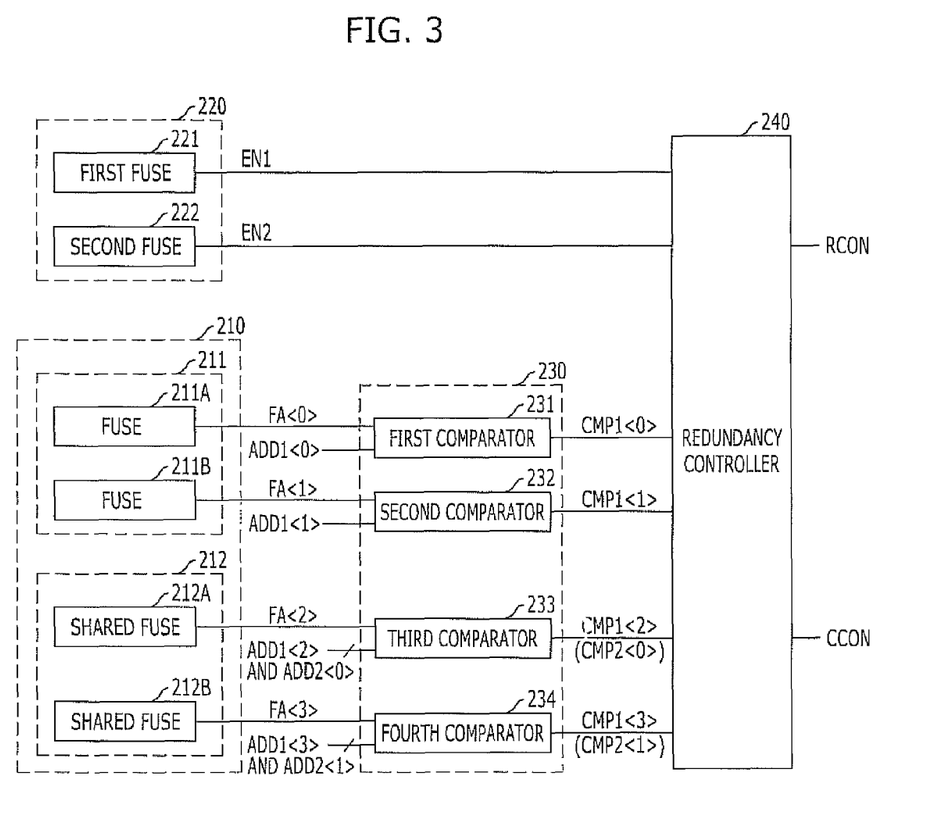
FIG. 3 is a diagram illustrating detailed components of a redundancy control circuit of FIG. 2.

FIG. 3 is a diagram illustrating detailed components of the redundancy control circuit of FIG. 2. The redundancy control circuit of FIG. 3 stores the fail address and shared information using the fuse.

As illustrated in FIG. 3, the redundancy control circuit is configured to include the fail address storage unit 210 storing the fail address, the shared storage unit 220 storing whether the value FA<0:N> stored in the fail address storage unit 210 corresponds to both of the first address and the second address, the address comparator 230 comparing the value FA<0:N> stored in the fail address storage unit with the first input address ADD1<0:N> and the second input address ADD2<0:M>, respectively, and the redundancy controller 240 controlling the redundancy operation in response to the values stored in the shared storage unit 220 and the comparison results of the address comparator 230.

Hereinafter, the redundancy control circuit will be described with reference to FIGS. 2 and 3. In particular, the detailed components and operation of the fail address storage unit 210, the shared storage unit 220, and the address comparator 230 will be described and the description of the components described with reference to FIG. 2 will be omitted.

The description of the first address and the second address is the same as described above with reference to FIG. 2. Hereinafter, the case in which the first address is the row address and 4 bits and the second address is the column address and 2 bits will be described. The number of bits of the address may be changed according to different design needs. The case in which designated bits ADD1<2:3> of the first address correspond to the second address ADD2<0:1> will be described (that is, when ADD1<2:3>=ADD2<0:1>, the first address and the second address may be stored in the single fail address storage unit 210).

The fail address storage unit 210 may be stored with the row address or the row address and the column address. As described above with reference to FIG. 2, the fail address storage unit 210 includes a first fail address storage unit 211 in which the stored values correspond to a portion of the first address and a second fail address storage unit 212 in which the stored values correspond to a portion of the row address or a portion of the row address and all of the column addresses. The first fail address storage unit 211 includes at least one fuse 211A and 211B (for example, two fuses are illustrated in FIG. 3) and the second fail address storage unit 212 includes at least one shared fuses 212A and 212B (for example, two shared fuses are illustrated in FIG. 3).

The shared storage unit 220 includes a first fuse 221 cut according to whether the fail address is stored in the fail address storage unit 210 and a second fuse 222 cut according to whether the values stored in the fail address storage unit 210 correspond to both of the first address and the second address. The row enable signal EN1 (first enable signal) is activated or inactivated according to the value stored in the first fuse 221 and the column enable signal EN2 (second enable signal) is activated or inactivated according to a value stored in the second fuse 222.

When the fail address is stored in the fail address storage unit 210, the first fuse 221 is cut and when the value FA<0:3> stored in the fail address storage unit corresponds to both of the row address and the column address, the second fuse 222 is cut. As described above with reference to FIG. 2, when the first fuse 221 is cut, the fail address stored in the fail address storage unit 210 corresponds to the row address and therefore, the row enable signal EN1 is activated. Further, when the second fuse 222 is cut, the values FA<0> to FA<3> stored in the fail address storage unit 210 correspond to both of the row address and the column address and when the row enable signal EN1 is activated according to whether the first fuse 22 is cut, the remaining column enable signal EN2 is activated according to whether the second fuse 222 is cut. According to an example, when the second fuse 222 is cut, the first fuse 221 is in a cutting state.

The comparator 230 includes first to fourth comparators 231 to 234 for comparing each bit ADD1<0> to ADD1<3> of the input row address (first input address) and each bit FA<0> to FA<3> of the values stored in the fail address storage unit 210. In this case, the first and second comparators 231 and 232 compare each bit FA<0> and FA<1> of the values stored in the first fail address storage unit 211 with some bits ADD1<0> and ADD1<1> of the input row address to generate some bits CMP1<0> and CMP1<1> of the first comparison information. In addition, third and fourth comparators 233 and 234 compare each bit FA<2> and FA<3> of values stored in the second fail address storage unit 212 with some bits ADD1<2> and ADD1<3> of the input row address to generate some bits CMP1<2> and CMP1<3> of the first comparison information or compare each bit FA<2> and FA<3> of the values stored in the second fail address storage unit 212 with each bits ADD2<0> and ADD2<1> of the input column address (second input address) to generate each bit CMP2<0> and CMP2<1> of the second comparison information.

Hereinafter, the operation of the redundancy controller 240 is the same as described above with reference to FIG. 2 and therefore, the description thereof will be omitted.

Figure 4:
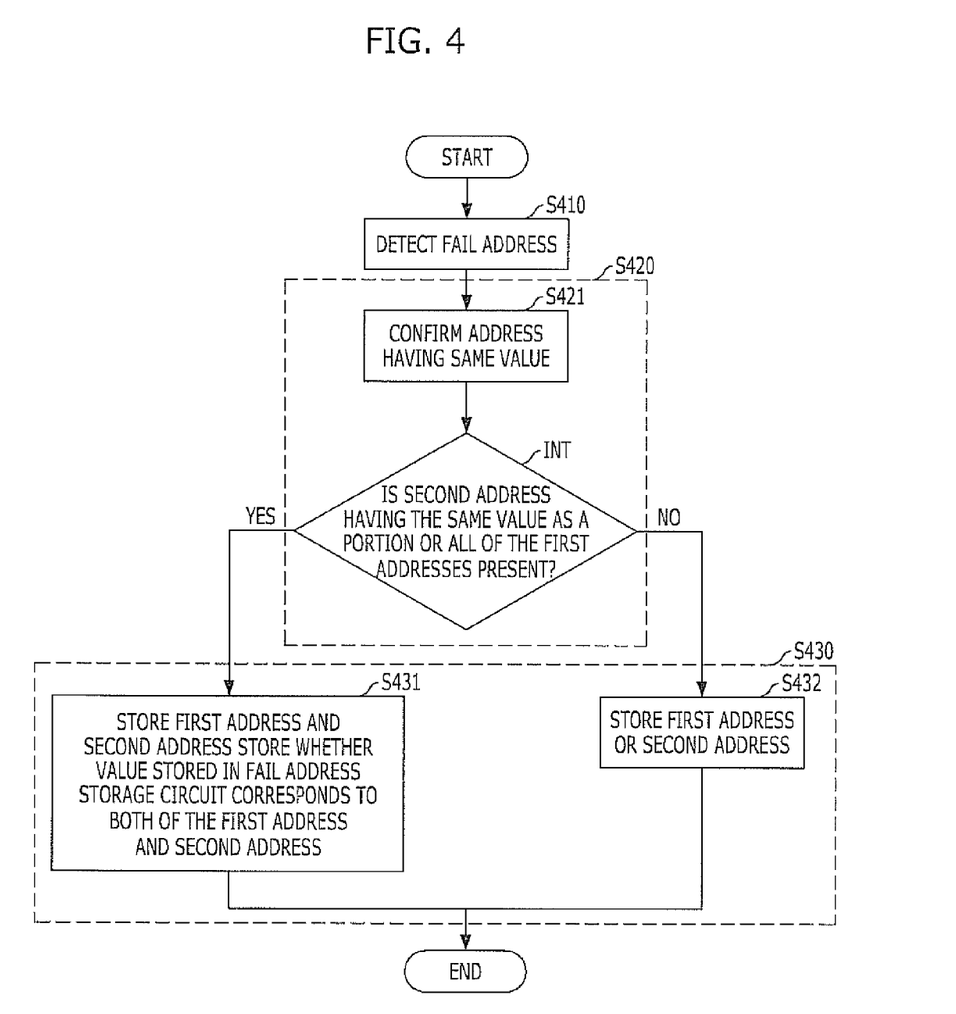
FIG. 4 is a flow chart for describing a method for storing fail addresses in accordance with the embodiment of the present invention.

FIG. 4 is a flow chart for describing a method for storing a fail address in accordance with an embodiment of the present invention.

As illustrated in FIG. 4, in a method for storing a fail address using a fail address storage circuit storing a fail address, the method for storing a fail address includes detecting one or more first address and one or more second address corresponding to one defective memory cell by testing the memory device (S410), detecting the second address having a value corresponding to the first address among one or more second address (S420), and storing the at least one first address and the at least second address, respectively, in the fail address storage circuit and storing the first address and the second address having a value corresponding to the first address in a single fail address storage circuit (S430). One of the first address and the second address may be the row address and the other one thereof may be the column address.

Hereinafter, the method for storing a fail address will be descried with reference to FIGS. 2 to 4.

When the method for storing a fail address starts, at least one row address and at least one column address are detected by first testing the memory device (hereinafter, referred to as the detecting of the fail address' (S410)) The method for detecting the fail address may be any well known, reasonably suitable method for detecting a fail address.

Next, at S420, at least one row address and at least one column address detected at S410 are aligned. In this case, the column address having the value corresponding to the row address among one or more column address is detected. In this case, the column address having the value corresponding to the row address means the column address having a value that is the same as some (first case) or all (second case) of the bits of the row address (the case in which the number of bits of the row address is more than the number of bits of the column address corresponds to the first case and the case in which the number of bits of the row address is equal to the number of bits of the column address corresponds to the second case. In this case, when the number of bits of the column address is equal to the number of bits of the row address or is more than the number of bits of the column address, the row address having the same value as some bits or all of the bits of the row address among at least one row address is detected (S421). Here, the meaning that the row address and the column address are the same as each other is one described with reference to FIG. 2.

Finally, the addresses detected at 'the detecting of the fail address' (S410) are each stored in the fail address storage circuit A (hereinafter, 'the storing of the fail address' (S430)). Here, at 'the detecting of the corresponding address' (S420), the row address and the column address that are not the same are each stored in the fail address storage circuit A (S432).

In the case of the fail address storage circuit A stored with the row address and the column address in which the corresponding address is not detected, the first fuse 221 of the shared storage unit 220 storing whether the fail address (row address or column address) is stored in the fail address storage unit 210 may be cut, while the second fuse 222 of the shared storage unit 220 storing whether the value stored in the fail address storage unit 210 corresponds to both of the row address and the column address may not be cut (proceeds to 'S432' according to 'NO' at 'INT'). The row address and the column address that correspond to each other are stored in the single fail address storage circuit A. In the case of the fail address storage circuit A stored with the row address and the column address that are the same as each other, the first fuse 221 of the shared storage unit 220 storing whether the fail address is stored in the fail address storage unit 210 and the second fuse 222 of the shared storage unit 220 storing whether the value stored in the fail address storage unit 210 corresponds to both of the row address and the column address may not be cut (proceeds to 'S432' according to 'YES' at 'INT').

The method for storing a fail address in accordance with the embodiment of the present invention has the same effect as the fail address storage circuit A of FIG. 2 and the redundancy control circuit of FIG. 2.

Figure 5:
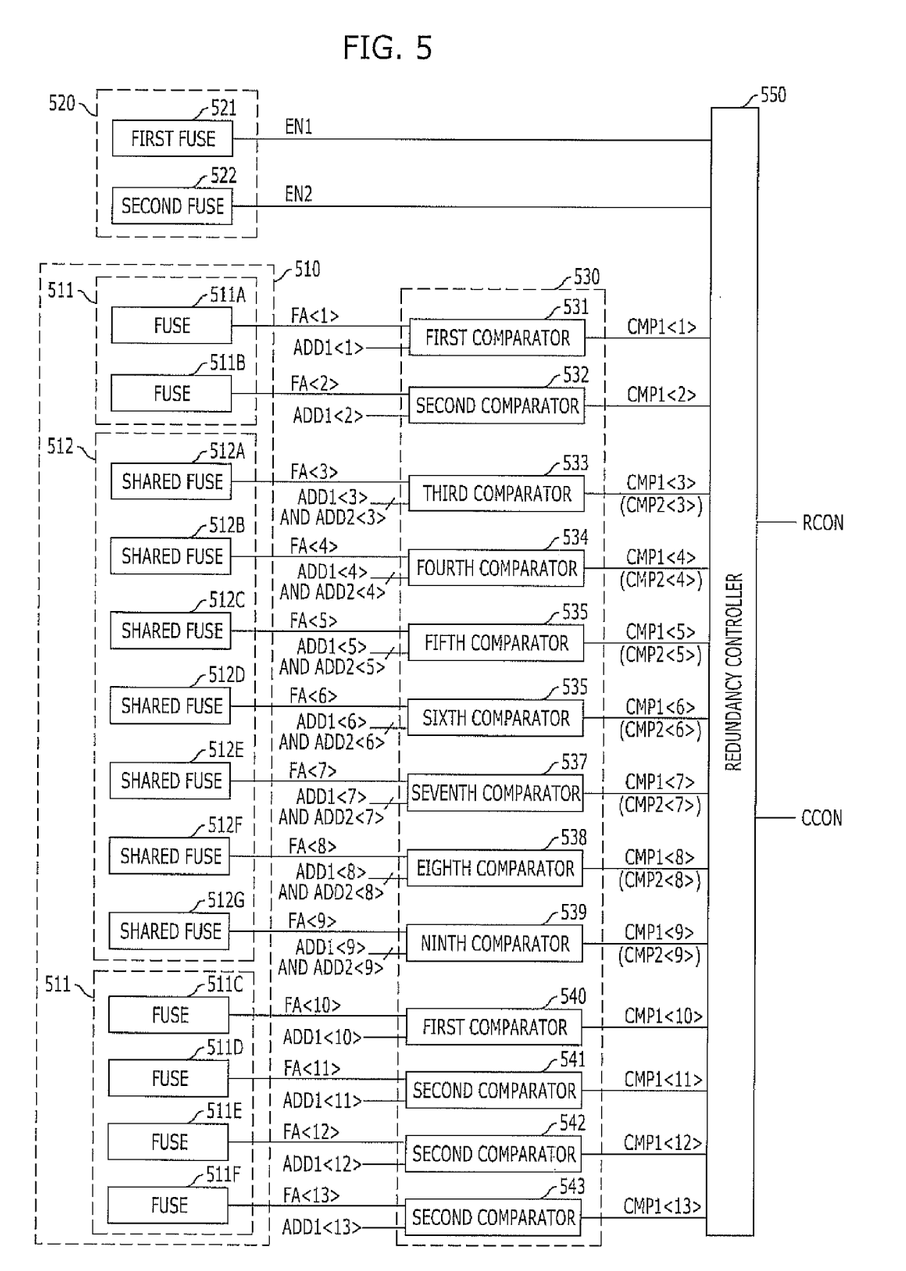
FIG. 5 is a diagram illustrating detailed components of a redundancy control circuit in accordance with another embodiment of the present invention.

FIG. 5 is a diagram illustrating detailed components of a redundancy control circuit in accordance with another embodiment of the present invention. The redundancy control circuit of FIG. 5 stores the fail address and the shared information using the fuse like the redundancy control circuit of FIG. 3.

As illustrated in FIG. 5, the redundancy control circuit is configured to include a fail address storage unit 510 storing the fail address, a shared storage unit 520 storing whether the value FA<1:13> stored in a fail address storage unit 510 corresponds to both of the first address and the second address, an address comparator 530 comparing the value FA<0:13> stored in the fail address with a first input address ADD1<1:13> input through No. 1 to No. 13 pins from the outside of the memory device and a second input address ADD2<3:9> input through No. 3 to No. 9 pins, respectively, and a redundancy controller 540 controlling the redundancy operation in response to the values stored in the shared storage unit 520 and the comparison results of the address comparator 530.

Hereinafter, the redundancy control circuit will be described with reference to FIGS. 2, 3, and 5. In particular, the detailed components and operation of the fail address storage unit 510, the shared storage unit 520, and the address comparator 530 will be mainly described and the description of the components described with reference to FIGS. 2 and 3 will be omitted.

The description of the first address and the second address is the same as one described with reference to FIG. 2. Hereinafter, the case in which the first address is the row address including 13 bits and the second address is the column address including 7 bits will be described. The number of bits of the address may be changed according to different design needs. As an example, the case in which the third to ninth bits ADD1<3:9> of the first address correspond to the second address ADD2<3:9> will be described (that is, when ADD1<3:9>=ADD2<3:9>, the first address and the second address may be stored in the single fail address storage unit 510).

The fail address storage unit 510 may be stored with the row address or the row address and the column address. As described above with reference to FIG. 2, the fail address storage unit 510 includes a first fail address storage unit 511 (511A-511F) in which the stored values correspond to a portion of the first address and a second fail address storage unit 512 (512A-512G) in which the stored values correspond to a portion of the row address or a portion of the row address and all of the column address. The first fail address storage unit 511 includes at least fuses 511A to 511F (for example, six fuses are illustrated in FIG. 5) and the second fail address storage unit 512 includes at least one shared fuses 512A to 512B (for example, seven shared fuses are illustrated in FIG. 3).

The shared storage unit 520 includes a first fuse 521 cut according to whether the fail address is stored in the fail address storage unit 510 and a second fuse 522 cut according to whether the values stored in the fail address storage unit 510 correspond to both of the first address and the second address. The row enable signal EN1 (first enable signal) is activated or inactivated according to the value stored in the first fuse 521 and the column enable signal EN2 (second enable signal) is activated or inactivated according to a value stored in the second fuse 522.

When the fail address is stored in the fail address storage unit 510, the first fuse 521 is cut, and when the value FA<1:13> stored in the fail address storage unit corresponds to both of the row address and the column address, the second fuse 522 is cut. As described above with reference to FIG. 2, when the first fuse 521 is cut, the fail address stored in the fail address storage unit 510 corresponds to the row address at least and therefore, when the first fuse 521 is cut, the row enable signal EN1 is activated. Further, when the second fuse 522 is cut, the values FA<1> to FA<13> stored in the fail address storage unit 510 correspond to both of the row address and the column address and when the row enable signal EN1 is activated according to whether the first fuse 521 is cut, the remaining column enable signal EN2 is activated according to whether the second fuse 522 is cut. Here, when the second fuse 522 is cut, the first fuse 521 is in a cutting state.

The comparator 530 includes first to thirteenth comparators 531 to 543 for comparing each bit ADD1<1> to ADD1<13> of the input row address (first input address) input to No. 1 to No. 13 pins (not illustrated in FIG. 5) to which the address of the memory device is input with each bit FA<1> to FA<13> of the values stored in the fail address storage unit 510. Here, first, second, tenth, eleventh, twelfth, thirteenth comparators 531, 532, 540, 541, 542, and 543 compare each bit FA<1>, FA<2>, FA<10>, FA<11>, FA<12>, and FA<13> of the values stored in the first fail address storage unit 511 with some bits ADD1<1>, ADD1<2>, ADD1<10>, ADD1<11>, ADD1<12>, and ADD1<13> of the input row address to generate some bits CMP1<1>, CMP1<2>, CMP1<10>, CMP1<11>, CMP1<12>, CMP1<12>, and CMP1<13> of the first comparison information. In addition, third and ninth comparators 533 and 539 compare each bit FA<3> to FA<9> of the values stored in the second fail address storage unit 512 with some bits ADD1<3> to ADD1<9> of the input row address to generate some bits CMP1<3> to CMP1<9> of the first comparison information or compare each bit FA<3> to FA<9> of the values stored in the second fail address storage unit 512 with each bits ADD2<3> to ADD2<9> of the input column address (second input address) to generate each bit CMP2<3> to CMP2<9> of the second comparison information.

According to an example, ADD1<M> represents the row address (first address) applied to No. M pin and ADD2<N> represents the column address (second address) applied to No. N pin. These matters are defined by JEDEC SPEC of DRAM.

Hereinafter, the operation of the redundancy controller 550 is the same as one described with reference to FIG. 2 and therefore, the description thereof will be omitted.

The method for controlling redundancy in accordance with the embodiment of the present invention will be described with reference to FIGS. 2 and 4.

In the method for controlling redundancy using the redundancy control circuit including the fail address storage circuit storing the fail address, the method for controlling redundancy includes activating the first enable signal EN1 and the second enable signal EN2 when the value FA<0:N> stored in the fail address storing circuit A corresponds to both of the first address and the second address at the time of the redundancy operation and controlling the first redundancy operation by comparing the value FA<0:N> stored in the fail address storage circuit A with the first input address ADD1<0:N> when the first enable signal EN1 is activated and controlling the second redundancy operation by comparing a value FA<K+1:N> stored in the fail address storage circuit A with the second input address ADD2<0:M> when the second enable signal EN2 is activated. Hereinafter, the case in which 'FA<K+1:N> of 'FA<0:N>' corresponds to the column address will be described. According to an example, 'FA<K+1> to FA<N> ' is an M+1 bit.

The method for controlling redundancy is a method for controlling a redundancy operation using the redundancy control circuit (FIG. 2) including the fail address storage circuit A stored with the fail address according to the method for storing a fail address illustrated in FIG. 4.

In this case, the first address ADD1<0:N> may be the row address, the second address ADD2<0:M> may be the column address, the first redundancy operation may be the row redundancy operation, and the second redundancy operation may be column redundancy operation, and vice versa. Hereinafter, the case in which the first address ADD1<0:N> may be the row address, the second address ADD2<0:M> may be the column address, the first redundancy operation may be the row redundancy operation, and the second redundancy operation may be column redundancy operation will be described.

When the redundancy operation starts, it is detected whether the fail address is stored in the fail address storage circuit A. If it is determined that the fail address is stored in the fail address storage circuit A, the first enable signal EN1 is activated. Further, when the value stored in the fail address storage circuit A corresponds to both of the first address and the second address, the second enable signal EN1 is activated. If it is determined that the fail address is not stored in the fail address storage circuit A, the enable signals EN1 and EN2 are not activated.

The comparator 230 outputs the comparison results of the first input address ADD1<0:N> with the value FA<0:N> stored in the fail address storage circuit A and outputs the comparison results of the second input address ADD2<0:M> with the value FA<K+1:N> stored in the fail address storage circuit A.

The redundancy controller 240 controls the row redundancy operation according to the comparison results of the first input address ADD1<0:N> with the value FA<0:N> stored in the fail address storage circuit A in the state in which the first enable signal EN1 is activated. Further, the redundancy controller 2 controls the column redundancy operation according to the comparison results of the second input address ADD2<0:M> with the value FA<K=1:N> stored in the fail address storage circuit A in the state in which the second enable signal EN2 is activated. For example, when the first input address ADD1<0:N> is equal to the value FA<0:N> stored in the fail address storage circuit A in the state in which the first enable signal EN1 is activated, the row redundancy operation is performed and when the second input address ADD2<0:M> is equal to the value FA<K+1:N> stored in the fail address storage circuit A in the state in which the second enable signal EN2 is activated, the column redundancy operation is performed.

The fail address storage circuit in accordance with the exemplary embodiment of the present invention can store whether the stored values correspond to all of the row address and the column address and store both the row address and the column address, when they have the same values for designated bits, in the single fail address storage unit. Therefore, the embodiment of the present invention can store more fail addresses using the same number of fail address storage units.

While the present invention has been described with respect to the specific embodiments, it will be apparent to those skilled in the art that various changes and modifications may be made without departing from the spirit and scope of the invention as defined in the following claims.

What is claimed is:

1. A redundancy control circuit, comprising:
   a fail address storage unit;
   a shared storage unit configured to store data indicating whether a fail address is stored in the fail address storage unit and whether the fail address corresponds to both of row and column addresses;
   an address comparator configured to compare the fail address with a row input address, and compare a part of the fail address with a column input address; and
   a redundancy controller configured to control a row redundancy operation when the fail address is stored in the fail address storage unit, and control row and column redundancy operations when the fail address corresponds to both of the row and column addresses, based on the data stored in the shared storage unit and comparison results of the address comparator.

2. The redundancy control circuit of claim 1, wherein the shared storage unit is configured to activate a first enable signal when the fail address is stored in the fail address storage unit and activate the first enable signal and a second enable signal when the fail address corresponds to both of the row and column addresses.

3. The redundancy control circuit of claim 2, wherein the redundancy control unit is configured to control a row redundancy operation when the first enable signal is activated and the fail address is equal to the row input address according to comparison results of the address comparator and control a column redundancy operation when the second enable signal is activated and the fail address is equal to the column input address according to comparison results of the address comparator.

4. A redundancy control circuit, comprising:
   a fail address storage unit;
   a shared storage unit configured to store data indicating whether a fail address is stored in the fail address storage unit and whether the fail address corresponds to both of row and column addresses;
   an address comparator configured to compare a first group of bits and a second group of bits stored in the fail address storage unit with a row input address, and compare the second group of bits stored in the fail address storage unit with a column input address; and
   a redundancy controller configured to control a row redundancy operation when the fail address is stored in the fail address storage unit, and controls row and column redundancy operation when the fail address corresponds to both of the row and column addresses, based on the fail address stored in the shared storage unit and comparison results of the address comparator.

5. The redundancy control circuit of claim 4, wherein the shared storage unit is configured to activate a first enable signal when the fail address is stored in the fail address storage unit and activate the first enable signal and a second enable signal when the fail address corresponds to both of the row and column address.

6. The redundancy control circuit of claim 4, wherein the fail address storage unit includes:
   a first fail address storage unit configured to store the first group of bits; and
   a second fail address storage unit configured to store the second group of bits the second group of bits.

7. A method for controlling redundancy using a redundancy control circuit including the fail address storage circuit storing the fail address, comprising:
   activating a first enable signal and a second enable signal when a fail address stored in the fail address storing circuit corresponds to both of a row and column addresses at the time of a redundancy operation; and
   controlling a row redundancy operation by comparing the fail address with a row input address when the first enable signal is activated, and controlling the row redundancy operation by comparing the fail address with the row input address and a column redundancy operation by comparing a part of the fail address with a column input address when the second enable signal is activated.

8. The method of claim 7, further comprising:
   inactivating the first and second enable signals when the fail address is not stored in the fail address storage circuit; and
   activating the first enable signal when at least one of the row and column addresses is stored in the fail address storage circuit.

* * * * *